United States Patent [19]

Groenenboom

[11] Patent Number: 4,912,396
[45] Date of Patent: Mar. 27, 1990

[54] CIRCUIT FOR THE DETECTION OF AN ASYMMETRY IN THE MAGNETIZATION CURRENT OF A MAGNETIC MODULATOR

[75] Inventor: Maarten Groenenboom, Enter, Netherlands

[73] Assignee: Holec Systemen en Componenten B. V., Hengelo, Netherlands

[21] Appl. No.: 258,500

[22] Filed: Oct. 17, 1988

[30] Foreign Application Priority Data

Oct. 15, 1987 [NL] Netherlands ............... 8702471

[51] Int. Cl.$^4$ .................. G01R 33/02; G01R 19/00
[52] U.S. Cl. ............................ 324/117 R; 324/127
[58] Field of Search ........... 324/117 R, 127; 363/26, 363/56; 323/246, 357, 358

[56] References Cited

U.S. PATENT DOCUMENTS 4,147,972 3/1979 Hochstetter .................. 323/246
4,255,705 3/1981 Milkovic ....................... 324/127

FOREIGN PATENT DOCUMENTS 0132745 7/1984 European Pat. Off. .

OTHER PUBLICATIONS

J. Lisser and A. J. van de Water; "Zero–Flux Current Transformer For Wide-Band Precision Measurement In AC and DC HV Systems"; IEE Fourth International Conference on AC and DC HV Power Transmission; London 23–26; Sep. 1985; pp. 229–234.
J. Lisser et al.; "Nullfluss-Stromwandler zur Messung von Gleich und Wechselstromen" ("Zero Flux Current Convertor for Measurement of Direct and Alternating Currents"); Elektrotechnische Zeitschrift 100; No. 24; 1979; pp. 1390–1394.

Primary Examiner—Ernest F. Karlsen
Attorney, Agent, or Firm—Watson, Cole, Grindle & Watson

[57] ABSTRACT

Circuit for detection of an asymmetry in the magnetization current, generated by a reference alternating voltage, in a magnetic modulator, in particular a magnetic modulator for zero-flux detection. This magnetic modulator comprises two virtually identical, wound magnet cores (T2, T3), each with a primary winding (W1) to be fed with a modulating current ($i_1$) and a series circuit of an auxiliary winding (W3) and an impedance (Z2, Z3) across which a voltage proportional to the magnetization current arises during operation. The reference alternating voltage ($U_m$) is fed to the respective series circuits (W3, Z2; W3, Z3) such that no resultant induction current is induced in the modulating current ($i_1$). The voltages over the impedances (Z2, Z3) form input signals for two peak value detectors (PD1, PD2), the strength of the output signal of which represents the degree of asymmetry of magnetization current. For processing the output signals of the two peak value detectors (PD1, PD2), devices (D) are provided which produce a virtually ripple-free output signal in the case of a symmetrical magnetization current. The invention also relates to a measurement circuit for the accurate measurement of direct and alternating currents.

8 Claims, 3 Drawing Sheets fig-1 (PRIOR ART)

CIRCUIT FOR THE DETECTION OF AN ASYMMETRY IN THE MAGNETIZATION CURRENT OF A MAGNETIC MODULATOR

BACKGROUND OF THE INVENTION

1. Field of the Invention

The present invention relates to a circuit for the detection of an asymmetry in the magnetization current caused by a reference alternating voltage in a magnetic modulator, in particular a magnetic modulator for zero flux detection with two virtually identical, wound magnet cores, each at least provided with a primary winding, to be fed with a modulating current and a series circuit of an auxiliary winding and an impedance across which a voltage proportional to the magnetization current is generated during operation, it being necessary to supply the reference alternating voltage to the respective series circuits such that no resultant induction current is induced in the modulating current, which circuit contains a peak value detector coupled to the impedance of a series circuit, the strength of the output signal of said detector representing the degree of asymmetry of the magnetization current.

2. Related Art

A circuit of this type is known from the article "Zero-Flux Current Transformer For Wide-Band Precision Measurement In AC and DC HV Systems", by J. Lisser and A.J. van de Water, Proceedings of IEE Fourth International Conference on AC and DC HV Power Transmission, London 23-26 Sept. 1985, p. 229-234.

Magnetic modulators are mainly used together with other electronic circuits as sensitive, wide-band direct current amplifiers. The fields of application are mainly in industrial measurement and control installations, medical equipment and laboratory instruments where a high degree of accuracy and stability is demanded.

The action of a magnetic modulator is based on the known non-linear magnetization curve of magnetic materials. In its simplest form a magnetic modulator consists of a core of magnetic material with a primary and a secondary winding. The current which is, for example, to be measured is supplied to the primary winding, while a symmetrical reference alternating voltage signal such that the core is periodically driven symmetrically in both directions to magnetic saturation is applied to the secondary winding.

As a consequence of, for example, a direct current component in the current to be measured the core is, however, pre-magnetized in a direction which depends on the direction in which this direct current component passes through the primary winding. The magnetization current which is generated by the reference alternating voltage signal and which without premagnetization of the core has a symmetrical course will, on the other hand, be asymmetric in shape with a premagnetized core, as a consequence of the non-linear magnetization curve thereof. The degree of asymmetry is dependent on the degree of premagnetization. In other words, the magnetization current generated by the reference alternating voltage signal is modulated by the current in the primary winding. With the aid of further electronic circuits, the degree and the direction of the asymmetry in the magnetization current can be determined, by which means, for example, information on the strength and the direction of the said direct current component can be obtained.

In practice diverse circuits have been proposed for the detection of the asymmetry. In the article "Nullfluss-Stromwander zur Messung von Gleich- und Wechselströmen" ("Zero Flux Current Convertor for Measurement of Direct and Alternating Currents") by J. Lisser et al., Elektrotechnische Zeitschrift 100 (1979) no. 24, p. 1390-1394, a so-called second harmonic magnetic modulator is proposed in which use is made of the feature, known from Fourier analysis, that pure symmetrical alternating voltage signals can be considered to be made up solely of a series of odd harmonic components while a asymmetric signal will also contain even as well as odd harmonic components, the second harmonic of which is in general the strongest.

A pure sine-shaped reference alternating voltage signal, which, for example, can be derived from the mains frequency, is now applied to the secondary winding of the magnetic modulator, the voltage generated by the magnetization current over an impedance connected in series with the secondary winding being fed to a second harmonic band filter. The output signal from this filter, which is a measure of the strength of the second harmonic component in the magnetization current, is fed to a synchronous rectifier, to which the second harmonic of the sine-shaped reference alternating voltage signal is also fed. The magnitude and the polarity of the output signal from this synchronous rectifier are then a measure for the magnitude and the sign of the mean value of the magnetization of the core caused by the current in the primary winding.

A second harmonic magnetic modulator of this type has, however, a number of disadvantages. Without premagnetization, i.e. when the magnetization current is purely symmetrical, the output signal of the synchronous rectifier is equal to zero, as a result of which noise and other interfering signals have a relatively great influence on the further processing of the output signal thereof. Furthermore, very stable, sharply delimited band filters must be used because otherwise the third order harmonic, which can be relatively strong, is fed as an undesired signal to the synchronous rectifier. As is known, the construction of sharply delimited band filters, especially at relatively low frequencies in the order of magnitude of 50-500 Hz, is very expensive. Because synchronous rectification is also very phase-sensitive, electronic components with a very high accuracy and stability must be used, which makes the circuit extra expensive. The band width of the magnetic modulator is limited by the accuracy of the components used.

In order to prevent the reference signal inducing a voltage in the primary winding of the core, a second identical core is added, the primary windings of the two cores being connected in series and the modulating current passing through both. The reference alternating voltage signal is now fed to the secondary windings such that no resultant induction current is induced in the modulating current, i.e. that the induction currents generated by the two cores cancel one another out.

In another circuit for the detection of an asymmetry in the magnetization current generated by the reference signal, a peak value detector is used in place of second harmonic detection, as mentioned in the introduction. The action of this detector can be understood as follows.

With a magnetization curve with a relatively sharp saturation bend the magnetization current will suddenly increase in the saturation region of the core because the self-induction of the secondary winding falls rapidly beyond the saturation bend and the magnetization current is in fact then determined solely by the impedance connected in series with tee winding. When the magnetization current is symmetrical, the positive and negative periods of the magnetization current have the same shape. Peak value rectification of the individual half periods and summation of this rectified signal theoretically gives an output voltage of zero volts in the case of perfect symmetry. When, as a consequence of a premagnetization of the core, the magnetization current is no longer symmetrical in shape, the rectified signals of the individual half periods will, after summation, give an output signal which is not equal to zero. The polarity and the magnitude of this output signal correspond to the direction and the magnitude of the premagnetization.

The use of a peak value detector in the magnetic modulator has the advantage over the said second harmonic detection that the circuit as a whole can be appreciably less expensive because, in contrast to the said second harmonic detection circuit, in the peak value detector it is not harmonic signals but the magnetization current itself, generated with the reference voltage, which is processed. This means that no expensive band filters, synchronous rectifiers and auxiliary circuits have to be used to obtain a precisely sine-shaped reference voltage.

A disadvantage of the circuit with peak value detector is, however, that in practice the output signal from this detector, in the case of a purely symmetrical magnetization current, always gives an undesired ripple voltage with a frequency equal to the frequency of the reference voltage. The magnitude of this ripple voltage is determined by the desired response time of the circuit. For a rapid response, the peak value detector must possess a time constant as small as possible. This means that the electrical charge which is stored in the peak value detector and is proportional to the peak values of the magnetization current must be discharged relatively rapidly, which, however, results in an increase in the size of the outlet ripple.

As with the second harmonic magnetic modulator, a second identical core is used in a similar manner in the magnetic modulator with peak value detector in order to prevent influencing of the modulating current as a consequence of the reference voltage.

SUMMARY OF THE INVENTION

The aim of the present invention is, now, to improve the circuit, mentioned in the introduction, for the detection of an asymmetry in the magnetization current generated by a reference alternating voltage in a magnetic modulator, whereby use is made of a peak value detector, such that a virtually ripple-free output signal can be provided. According to the invention this is achieved in that the circuit contains a similar further peak value detector coupled with the impedance of the other series circuit and means for processing the difference signal of the output signals of the two peak value detectors, the output signal of said means being virtually ripple-free in the case of a symmetrical magnetization current.

According to the invention use is now made with advantage of the second identical core which has already been added to the magnetic modulator to prevent an undesired influence on the modulating current. Without premagnetization, i.e. with a symmetrical magnetization current, the output signals of the two peak value detectors are exactly identical and in phase, so that the difference signal of these does not contain any ripple. However, because the two cores are magnetized in opposing directions by the reference voltage in order to prevent a resultant induction current in the primary winding, or the modulating current passes through these cores, the output signals of the two peak value detectors will as a consequence of a direct current component in the modulating current, be mutually shifted in phase by 180°. The difference signal of the two peak value detectors then contains the two-fold information of the modulating current. This has the great advantage that interfering signals will have a relatively smaller influence on the output signal of the circuit and/or that a higher interference level is permissible to achieve the same performance as with the known circuit with a single peak value detector.

Without there being a danger that too great ripple voltages will arise, the time constant of the circuit according to the invention can be appreciably reduced compared with that of the known circuit, so that rapid variations or transient direct current components in the modulating current can be followed very well. When the magnetic modulator according to the invention is used in the zero flux current transformer already mentioned above, a measurement circuit can be provided with a higher accuracy and greater band width than the measurement circuits known from the said state of the art.

Based on a circuit which is already used in practice for the detection of an asymmetry in the magnetization current of a magnetic modulator, in which one peak value detector is a peak rectifier, made up of first and second devices with a diode action which, respectively, are connected to first and second elements with a capacitive action such that a portion of the positive half period of the voltage of one series circuit, which is proportional to the magnetization current, is stored in the first element having a capacitive action and a portion of the negative half period is stored in the second element having a capacitive action, and summation devices for the summation of the voltage over the first and second elements having a capacitive action, the output of the summation devices constituting the output of one peak value detector, the preferred embodiment of the circuit according to the invention is characterized in that third and fourth devices with a diode action are provided which, respectively, are connected to third and fourth elements with a capacitive action such that a portion of the positive half period of the voltage of the other series circuit, which is proportional to the magnetization current, is stored in the third element having a capacitive action and a portion of the negative half period is stored in the fourth element having a capacitive action, and further summation devices for the summation of the voltage over the third and fourth elements having a capacitive action, the output of the further summation devices constituting the output of the further peak value detector.

With the circuit made up in this way the half periods of the voltage, which is proportional to the magnetization current, across the impedances of the two series circuits are rectified individually and a portion about the peak value hereof is stored in the respective elements having a capacitive action, which elements can be combinations of one or more capacitors. The response time of this circuit is determined by the discharge time of the respective elements having a capacitive action. Because it is mainly the peak value of the voltage, which is proportional to the magnetization current, which is stored and because it is possible to work with relatively high voltages, any threshold voltage of the rectifying devices used has a negligible effect. This means that semiconductor diodes can be used for rectification of the individual half periods, as a result of which a very inexpensive circuit which is relatively simple in construction from the circuit technology standpoint can be obtained.

Because the output signal of the circuit according to the invention is the difference signal of the output signals of the two peak value detectors, which are relatively small ripple voltages in the case of a symmetrical magnetization current, the semiconductor diodes used must as far as possible have identical forward characteristics in order to obtain a ripple-free output signal. For this purpose a further embodiment of the invention is characterized in that the first, second, third and fourth devices having a diode action are semiconductor diodes which have virtually identical characteristics and are located in the same substrate of semiconductor material. The degree of freedom from ripples is furthermore, of course, also determined by the accuracy of the capacitors and summation devices used.

Yet a further embodiment of the circuit according to the invention is characterized in that the first, second, third and fourth devices having a diode action each consist of a differential amplifier, the output of which is connected to the inverting input via a series circuit of a resistance and a semiconductor diode and a further semiconductor diode connected anti-parallel to this series circuit, the forward direction of the devices having a diode action which are thus formed corresponding to the forward direction of the semiconductor diode in the series circuit and the anode and cathode connections corresponding herewith being formed by the connection point of the resistance and the semiconductor diode and by the free electrode of a further resistance connected to the input of the differential amplifier.

Although the circuit with rectifying devices constructed in this way is more expensive compared with the use of single semiconductor diodes, it is, however, possible by this means virtually completely to correct any mutual differences between the respective devices having a diode action by suitable variation of the said resistances. Zero-flux current transformers, for example, fitted with an accurate magnetic modulator of this type will preferably be employed where maximum accuracy is demanded, such as, for example, in laboratory applications, for scientific purposes etc. For series production, however, the circuit according to the invention in which the voltage, which is proportional to the magnetization current, is rectified directly by single semiconductor diodes is to be preferred.

According to yet a further embodiment of the circuit according to the invention, the devices for processing the output signals of the two peak value detectors comprise devices for the summation of these output signals. These devices for the summation of the output signals can be provided by means of resistances and inverters.

The preferred embodiment of the circuit according to the invention is further characterized in that the devices for the summation of the output signals of the two peak value detectors comprise a differential amplifier, the respective outputs of the detectors being connected to a differential input of this differential amplifier and the output hereof constituting the output of the circuit. Together with its relative simplicity, the use of a differential amplifier offers the advantage that any differences in the output signals of the two peak value detectors, for example as a consequence of an imbalance between the transformer cores, ultimately can still be corrected by the suitable adjustment of this differential amplifier such that the freedom of the output signal from ripples, which is the aim, is as optimum as possible over as great a frequency range as possible.

It will be clear that when peak value detection is used the magnetization current should preferably possess pulsed character. It has been found that the magnetization current with the circuit according to the invention, with which the reference alternating voltage fed to the magnetic modulator is generated by an oscillator, has as much as possible a pulsed pattern when the oscillator gives a triangular signal.

The invention also relates to a measurement circuit for the accurate measurement of direct and alternating current, at least comprising a virtually identical first, second and third transformer, with primary windings, connected in series, to be fed with the current to be measured, and secondary windings, connected in series, and connected to the output of an amplifier circuit, and with auxiliary windings, the auxiliary winding of the first transformer being connected to the input of the amplifier circuit and the auxiliary winding of the second and third transformer each constituting a series circuit with an impedance and reference voltage source, which impedances are each connected to an input of a circuit according to the invention, the output of which is connected to the input of the amplifier circuit.

It is pointed out that a magnetic modulator according to the zero-flux principle, with which an asymmetry in the magnetization current is detected not with a peak rectification circuit but with a pulse-position modulation circuit, is known from European Pat. Application No. 0,132,745. The modulator consists of a magnetic core which surrounds a primary winding and at least two magnetic conductors arranged in recesses in the core such that their state of magnetization is influenced by the magnetic field of the core. The magnetic conductors comprise first windings to which the reference alternating voltage is supplied in counter-phase and second windings in which voltages are generated which are mutually asymmetrical in the case of a residual magnetic flux in the core.

In the preferred embodiment of this European Patent Application the voltages generated in the second windings are each supplied to a differentiator with a discriminator connected behind this. If the voltages of the second windings are mutually asymmetrical, the peak values thereof will be mutually shifted relative to the situation in which the voltages are purely symmetrical. The peak values are detected with the aid of the differentiator and discriminator and processed via a logical circuit to a block wave signal, the duty cycle of which is determined by the mutual shift of the respective peak values.

This block wave signal is then used as the control signal for electrical switches for charging an integration capacitor with a power source or discharging said capacitor. The charging condition of this integration capacitor, that is to say the amount of charge and polarity, is a measure of the direct current component in the current to be measured. By means of an amplifier which is coupled to the integration capacitor and supplies a compensation winding fitted on the core, the zero flux condition is restored in the core.

Contrary to the circuit according to the invention, with which an asymmetry in the magnetization current is detected and processed completely by analogue means, which has a favourable effect on the simplicity of construction and consequently the response time of the circuit, in the said European Pat. Application No. 0,132,745 an extra logical processing circuit and switching elements are necessary to influence the charge condition of the integration capacitor. In contrast to the peak rectification circuit used in the invention, the pulse-position modulation circuit is more complex and of more extensive construction, which has an adverse effect on the ultimate response time of the circuit.

BRIEF DESCRIPTION OF THE DRAWINGS

Several embodiments of the circuit according to the invention will be explained in more detail below with the aid of an application in a zero-flux current transformer.

DETAILED DESCRIPTION OF THE PREFERRED EMBODIMENTS

Figure 1:
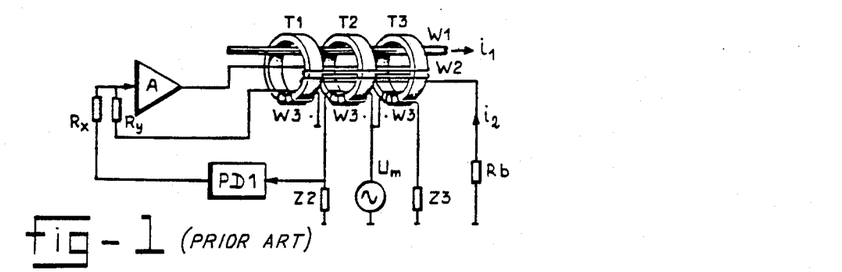
FIG. 1 shows schematically the known application of a magnetic modulator with a single peak value detector in a zero-flux current transformer.

FIG. 1 shows schematically the construction of a zero-flux current transformer consisting of the wound annular core transformer T1, which is fitted around a conductor W1 which constitutes the primary winding W1 through which the current $i_1$ to be measured flows. The wound annular core transformers T2 and T3 which are identical to T1 and which likewise contain the conductor W1 form part of a magnetic modulator which also contains the reference alternating voltage source Um, the impedances Z2 and Z3 and a peak value detector PD1.

To clarify the action of the zero-flux current measurement principle we consider, in the first instance, the core T1, which is provided with a secondary winding W2 which is incorporated in the output circuit of an amplifier A and has a control winding W3, which is connected via a resistance Ry to the input of the amplifier A. The output circuit of A is closed by a loading resistance Rb. The polarity of the magnetomotive force in W2 which is generated by the output current $i_2$ of the amplifier A is such that each change in the flux in the core T1 is nullified under the influence of the voltage induced in W3.

Assuming an ideal amplifier with a frequency-independent infinite amplification factor and no interfering voltages, including zero point drift, no change in the magnetic flux in the core T1 is then permitted. After all, a change in flux would result in an induced voltage in the winding W3, which change in flux is nullified again by the output current $i_2$ of the amplifier. The induced voltage in W3 and consequently the magnetic flux in the core will thus be equal to zero. The amplifier will thus send a current through the winding W2 such that the magnetomotive force generated by W1 is compensated. Consequently, the current in the secondary circuit is, as a result, an accurate image of that in the primary circuit but w1/w2 times as great, where w1 is the number of windings on the primary winding W1 and w2 is the number of windings on the secondary winding W2.

In reality the amplification factor is finite and frequency-dependent and there is zero point drift. As a result of this, however, a slight voltage for the flux compensation will be induced in W3 in order to maintain the magnetomotive force balance. The current required for this purpose gives rise to a measurement error. Because, depending on the nature of the current to be measured and the zero point drift, the change in flux does not have to change size, the core can become saturated after some time. Normal operation is then no longer possible. This drawback is eliminated by using the magnetic modulator with which a deviation of the mean value of the flux relative to zero is detected.

In the circuit according to FIG. 1, this magnetic modulator consists of the two wound annular core transformers T2 and T3, of which the primary windings W2, connected in series, are incorporated in the output circuit of the amplifier A, and which each comprise a series circuit consisting of a control winding W3 and, respectively, an impedance Z2 and Z3, which two series circuits are fed by the reference alternating voltage source Um. The direction of winding of the windings W3 of, respectively, T2 and T3 is such that no resultant induction current is induced in the primary winding W1 as a consequence of the change in flux caused by Um.

The reference alternating voltage source Um has dimensions such that the voltage thereof results in a magnetization current by which the two cores T2 and T3 are driven periodically to magnetic saturation first in the one and then in the other direction.

The strength of the magnetization current flowing in the windings W3 of, respectively, T2 and T3 is determined by the amplitude of Um, the self-induction of the windings W3 and the respective impedances Z2 and Z3. When a core becomes saturated the self-induction thereof will, when the magnetization curve has a relatively sharp saturation bend, fall relatively rapidly beyond this saturation bend in the saturation region. This means that the current in the respective series circuits is then determined virtually by the amplitude of Um and the value of the impedances Z2 and Z3. When the two impedances Z2 and Z3 are resistances with a value which is small relative to the unsaturated self-induction of the two cores T2 and T3, the current through the impedances will increase relatively rapidly when these cores become saturated, as a result of which a voltage with a pulsed pattern will arise across these impedances.

Figure 2:
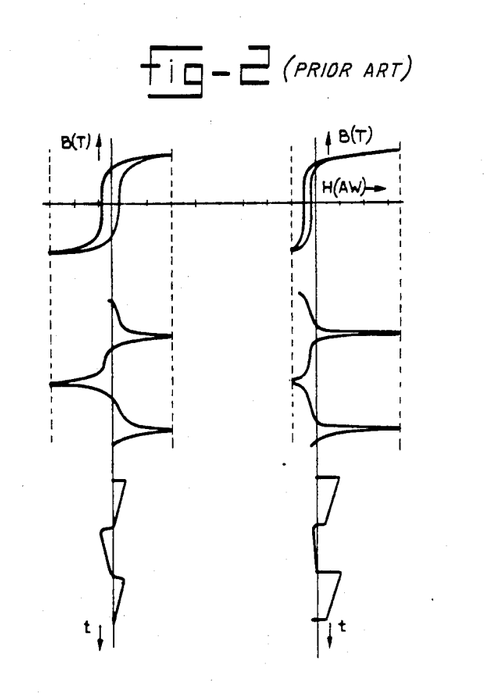
FIG. 2 shows signal shapes to illustrate the action of the magnetic modulator with a single peak value detector according to FIG. 1.

The form of the magnetization current is shown in FIG. 2, in which the left half illustrates the situation without a residual magnetic field, that is to say with a mean value of the flux equal to zero, and the right half illustrates the situation with a mean residual magnetic field in the cores which is not equal to zero. The known magnetization curve of the cores is shown on the first line of FIG. 2 and the magnetomotive force proportional to the magnetization current is shown on line 2.

If the mean value of the flux in the cores is zero, the magnetization current will have pulsed, symmetrical pattern corresponding to the form shown on line 2 in the left half of FIG. 2. The positive and negative peak values are identical.

For a mean value of the flux not equal to zero, for example as a consequence of zero point drift or a direct current component in the current $i_1$ to be measured, the magnetization current of the magnetic modulator will no longer be symmetrical and, for example, will have a form such as that shown on line 2 in the right half of FIG. 2. The positive and negative peak values are no longer the same as one another.

By now, in accordance with FIG. 1, feeding the positive and negative halves of the magnetization current to the peak value detector, which deducts the peak values of the positive and negative half period from one another after peak rectification, the output signal thereof will have the pattern indicated on line 3 of FIG. 2 in the time t. In the case of a symmetrical magnetization current, i.e. without residual magnetic field, the positive and negative peak values are identical, as a result of which a symmetrical output signal corresponding to the left half of FIG. 2 appears at the output of the peak value detector, the amplitude of said signal being determined by the time constant of the peak value detector.

In the situation shown in the right half of FIG. 2, the positive and negative peak values are not equal to one another and an asymmetric output signal corresponding to that indicated on line 3 of this figure will form, the polarity and magnitude of which are a measure for the sign and the magnitude of the residual magnetic field in the cores.

By now, as indicated in FIG. 1, feeding this signal together with the signal from winding W3 of T1 via a resistance Rx in the correct polarity to the amplifier A, this will supply an output current $i_2$ such that the residual magnetic field in the cores is eliminated.

Figure 3:
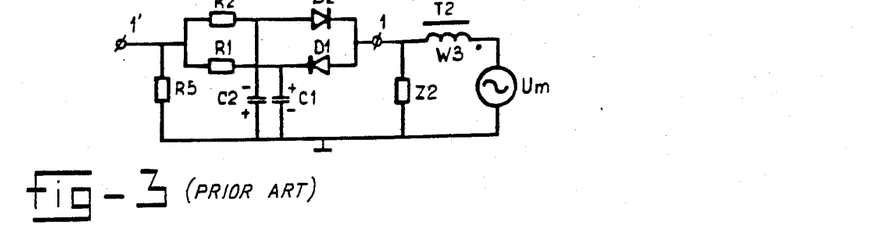
FIG. 3 shows schematically the construction of the peak value detector from FIG. 1.

FIG. 3 shows schematically the construction of a peak value detector used in practice. The anode of diode D1 is connected to the cathode of diode D2 and their connection point forms the input terminal 1 of the peak value detector. A capacitor C1 is connected between the cathode of the diode D1 and ground, and an identical capacitor C2 is connected between the anode of the diode D2 and ground. In addition, a resistance R1 is connected to the cathode of the diode D1, and an identical resistance R2 is connected to the anode of the diode D2, which resistances are connected to one another by their other electrodes and form the output terminal 1' of the peak value detector. Furthermore, a resistance R5 is connected between the output terminal 1' and ground. The action of the peak value detector formed in this way is illustrated with the aid of the voltage forms shown in FIG. 4 for the situation without residual magnetic field in the cores.

Figure 4:
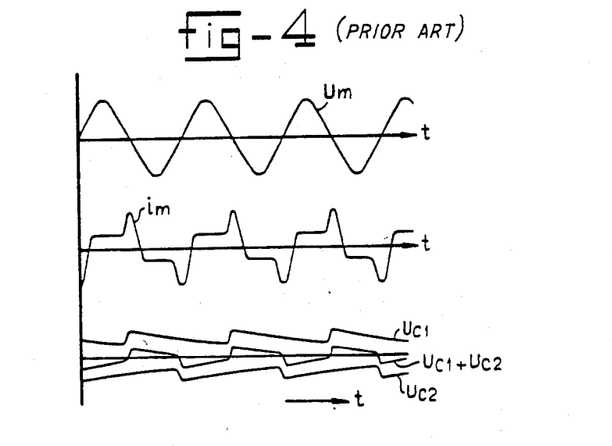
FIG. 4 shows signal shapes to illustrate the action of the peak value detector according to FIG. 3.

The sine-shaped alternating voltage, as indicated on the first line of FIG. 4, fed in this example by the reference alternating voltage source Um to the control winding W3 of the core T2 results in a pulsed magnetization current $i_m$, as indicated on the second line of FIG. 4. The pulsed pattern of the magnetization current $i_m$ is generated at the time the core T2 becomes saturated. Because the core T2 is made of a material with a sharp saturation bend in the magnetization curve, the self-induction of the winding W3 will suddenly decrease rapidly beyond this bend when the core becomes saturated, as a result of which the current $i_m$ in the circuit is determined virtually solely by the amplitude of the alternating voltage Um and the value of the impedance Z2. The peak value of the positive half period of the voltage across Z2 will be stored, via the diode D1, in the capacitor C1, and the peak value of the negative half period of the voltage across Z2 will be stored, via the diode D2, in the capacitor C2. The voltage $U_c1$ across the capacitor C1 and the voltage $U_c2$ across the capacitor C2, which have an opposite polarity relative to ground, are added together via the resistances R1 and R2 and the resistance R5. The voltage given at the output terminal 1' of the peak value detector is the sum of the voltages $U_c1$ and $U_c2$ across the respective capacitors.

The pattern of the capacitor voltages seen in the time t is illustrated on the third line of FIG. 4. Between two positive peaks of the magnetization current $i_m$ the charge stored in the capacitor C1 will flow away via the resistances R1 and R2 to the capacitor C2 and via the resistances R1 and R5 to ground. As a result the voltage $U_c1$ decreases, for example as shown. The charge in the capacitor C2 will flow away between successive negative peaks, which results in a similar fall in the voltage $U_c2$. The output voltage ($U_c1+U_c2$) at the output terminal 1' of the peak value detector is consequently a ripple voltage with double the frequency of the capacitor voltages, as shown in FIG. 4 and in the left half of FIG. 2 on line 3.

As a rapid response of the circuit is desirable, the discharge time of the capacitors may not be too great. This means that the resistances R1 and R2 may not be too large. However, reducing R1 and R2 results in a more rapid discharge of the capacitors C1 and C2 and thus in a greater ripple voltage at the output 1' of the peak value detector. If this is used in the circuit according to FIG. 1, the ripple voltage has an effect on the output signal of the zero-flux current transformer and causes a measurement error in this. It is not possible to filter away this ripple voltage because, as can be seen from FIG. 2, a residual flux in the core does not result in a change in the frequency of the output signal but only in an increase in the direct current energy content of this. The incorporation of threshold values to remove the ripple voltage is an uneconomic solution because, in the case of the zero-flux current transformer, each transformer must be adjusted individually and in time, as a consequence of ageing and the like, the strength of the ripple voltage and the setting of the threshold values will drift, as a result of which an unknown measurement error will arise.

Figure 5:
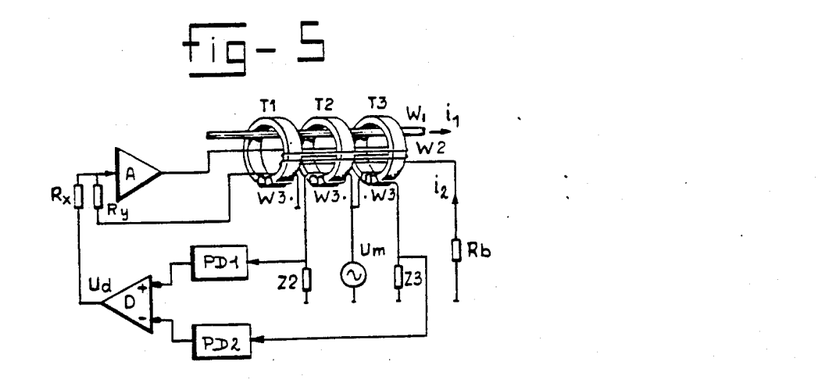
FIG. 5 shows schematically the circuit according to the invention with two peak value detectors used in the zero-flux current measurement circuit according to FIG. 1.

According to the invention this ripple voltage can be reduced virtually to a minimum simply and solely dependent on the tolerances of the electronic components used by adding a further peak value detector PD2 as in FIG. 5, which like FIG. 1 shows the application of a magnetic modulator in a zero-flux current transformer. The input signal of this additional peak value detector PD2 is the voltage over Z3, which is proportional to the magnetization current in the series circuit formed by the impedance Z3 and the control winding W3 of the core T3. The core T3 is, as already indicated, present in the magnetic modulator to prevent a resultant induction current arising as a consequence of the reference alternating voltage Um in the primary winding W1 or in the current $i_1$.

The difference signal $U_d$ of the output signals of the two peak value detectors PD1 and PD2, which, for example, can be obtained with the aid of a differential amplifier D, is fed, in a manner similar to that discussed with the aid of FIG. 1, via the resistance Rx to the amplifier A. The action of the circuit is now as follows.

Assuming that the voltages arising over the impedances Z2 and Z3 are identical to one another in respect of form and amplitude, the output signals of peak value detectors PD1 and PD2 will, if these detectors are identical, likewise be identical to one another in respect of form and amplitude. Without a residual magnetic field in the cores T2 and T3, i.e with a symmetrical magnetization current $i_m$, the two peak value detectors will give symmetrical ripple voltages which are identical and in phase with one another. The difference signal of these two ripple voltages is then, depending on the tolerances of the electronic components used, virtually equal to zero, i.e. ripple-free.

Because the directions of winding of the two windings W3 of, respectively, the cores T2 and T3 are opposite, as is indicated in a known manner in FIG. 5 by a point, a rectified residual flux in the cores T2 and T3 will result in voltages which are mutually shifted 180° in phase over the impedances Z2 and Z3. Depending on the direction of the residual flux, for example, the core T2 will show a saturation peak for the negative half periods of the reference alternating voltage Um and the core T3 will show a saturation peak for the positive half period of Um, as on the second line in the right section of FIG. 2. The output signals of the two peak value detectors will now have the form shown on the third line in the right section of FIG. 2 but will be mutually shifted 180° in phase. The difference signal of the output signals of the two peak value detectors now contains double the information with regard to the direction and the magnitude of the residual magnetic field.

It will be clear that the direction of winding of the two control windings W3 of, respectively, T2 and T3 mutt be chosen the same as one another when the opposite direction of winding is chosen for the windings W1, W2 of T2 and T3. In this latter case, the residual magnetic fields in the cores T2 and T3 will, namely, be opposite to one another, so that for an identical direction of winding of the windings W3 hereof, the voltages over the impedances Z2 and Z3 will be mutually shifted 180° in phase.

In the case of a symmetrical magnetization current, i.e. without residual magnetic field in the cores, the difference signal of the two peak value detectors is ripple-free irrespective of the magnitude of the ripple voltages hereof, and the difference signal in the situation with a residual magnetic field contains double the flux information. As a result, the time constant of the peak value detector can be reduced without the danger of ripple voltage or loss of information. This means a more rapid response of the peak value detector, as a result of which, for example, step-wise, pulsed or transient direct current components in the current $i_1$ will be able to be followed more rapidly. This latter is in particular of importance in the case of application in measurement and control engineering.

Figure 6:
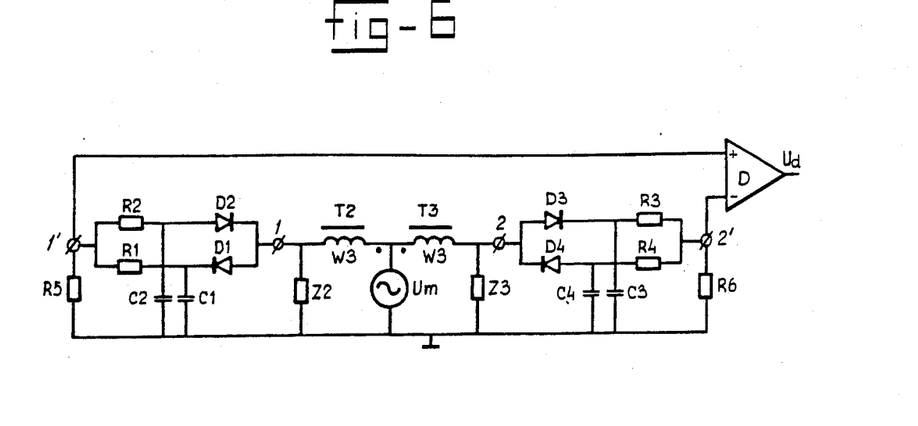
FIG. 6 shows schematically the construction of the circuit according to the invention.

FIG. 6 shows the circuit diagram of the double peak value detection according to the invention. The section to the left of the reference alternating voltage source Um corresponds to the circuit shown in FIG. 3. In the section to the right of the reference alternating voltage source Um an additional peak value detector with input terminal 2 and output terminal 2' is connected across the impedance Z3, which detector, corresponding to the peak value detector shown in FIG. 3, is constructed with diodes D3 and D4, capacitors C3 and C4 and resistances R3, R4 and R6, as shown. The output terminals 1' and 2' respectively are connected to the positive and negative input terminal respectively of a differential amplifier D, the output signal $U_d$ of which is the difference signal of the voltage of the two peak value detectors. It will be clear that in place of a differential amplifier it is also possible, in a known manner, to use other electronic devices for the summation of the output voltages of the peak value detectors.

A precondition for the use of the circuit according to FIG. 6 is that the corresponding components of the circuit are accurately identical to one another and have a low tolerance. This applies in particular for the semiconductor diodes D1, D2, D3 and D4 used, which must have identical forward characteristics. This can be achieved by using diodes which are located in the same substrate of semiconductor material. Diodes of this type are available commercially.

As can be seen from FIG. 6, the circuit according to the invention can be constructed in a relatively simple and inexpensive manner with electronic components available commercially. By a suitable choice of the impedances Z2 and Z3 and the amplitude of the reference alternating voltage Um, the voltage arising across these impedances can be made sufficiently large, so that on peak rectification hereof the threshold voltages of the diodes D1, D2 and, respectively, D3, D4 have no discernible influence.

Figure 7:
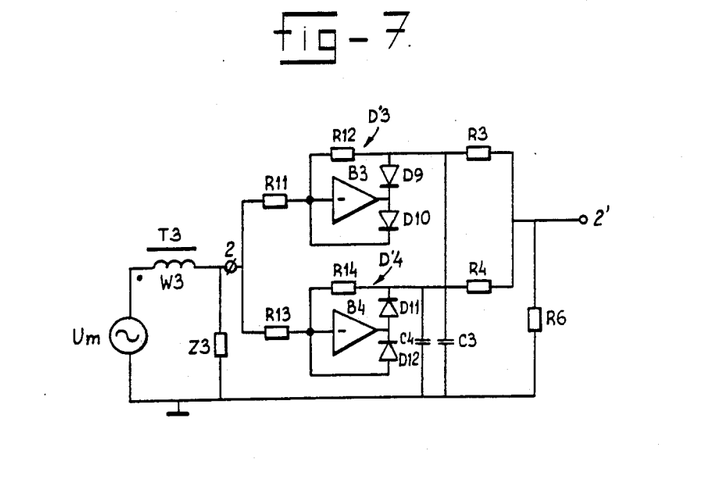
FIG. 7 shows a section of the circuit according to the invention, in which electronic circuits are used as rectifiers.

When, however, it is desired to reduce even further the influence of these diode thresholds and any inequality in the forward characteristics hereof, use can advantageously be made of the "electronic" rectifying devices D'3 and D'4 which are shown in FIG. 7 and which correspond to the semiconductor diodes D3 and D4 respectively of FIG. 6. For the sake of simplicity, only a portion of the circuit according to the invention is shown in FIG. 7. The missing portion can easily be added in accordance with FIG. 6, in a similar manner. The rectifying devices D'3 and D'4 are constructed as shown in FIG. 7 and each consist of, respectively, a differential amplifier B3; B4, the output of which is connected via a series circuit of a resistance R12; R14 and a semiconductor diode D9; D11 and a further semiconductor diode D10; D12 connected to anti-parallel to this series circuit, to the inverting input of the differential amplifier, the forward direction of the rectifying devices corresponding to the direction of the semiconductor diode D9; D11 in the series circuit. The anode and cathode connections are formed by the connection point of the resistance and the semiconductor diode, R12, D9; R14, D11 and the free end of a further resistance R11; R13 connected to the input of the differential amplifier B3; B4. The resistances R11; R12 and R13; R14 are preferably chosen equal to one another, but can also be varied such as to equalize any differences in the rectifying action between D'3 and D'4 of the one peak value detector or between the peak value detectors themselves.

To explain the action of these "electronic" rectifiers, we consider, for example, D'3. A positive voltage at the inverting input of B3 results in an output signal if R11=R12, which is of equal magnitude but opposite, because D9 conducts. A negative voltage, on the other hand, is completely suppressed via the then conducting diode D10, so that the output voltage of B3 is zero. Corresponding reasoning applies in the case of D'4.

Although the circuit shown in FIG. 7 will, as a result of the use of several electronic components, which will also take up more space on a plate with printed wiring, be more expensive and the band width will be smaller compared with the circuit in FIG. 6, especially when the diodes D1, D2, D3 and D4 are so-called rapid semiconductor diodes, the circuit according to FIG. 7 can be used in particular where accuracy is a high requirement.

It has been found that a magnetization current pattern which is pulsed as far as possible can be achieved when, in place of a sine-shaped reference alternating voltage, a triangular alternating voltage generated by an oscillator is fed to the control windings W3 of, respectively, the cores T2 and T3. In this case the influence of the diode threshold of the semiconductor diodes will exert an even relatively smaller influence.

It is pointed out that American Pat. No. 4,255,705 discloses a magnetic modulator for use in a kWh-meter which has peak detection and hold circuits which, however, together form only a detection circuit which functionally is comparable with the circuit according to FIG. 3 or FIG. 7. The various features are such that the circuits in the blocks 12 and 13 according to FIG. 2 of this American Patent correspond, respectively, to D1, C1 and D2, C2 according to FIG. 3 or D'3, C3 and D'4, C4 according to FIG. 7 of the present application. The summation circuit according to block 14 of U.S.-A-4,255,705 corresponds to the resistance circuits R1, R2 and R5 according to FIG. 3 or R3, R4 and R6 according to FIG. 7 of the present application. From the standpoint of circuit technology, the summation circuit 4 according to this American patent then also does not have the function of a summation circuit for the processing of the output signals of two separate peak rectification circuits, such as, for example, the differential amplifier D used in one embodiment of the invention.

Although the measurement circuit according to the invention has been discussed and illustrated with the aid of an application in a zero-flux current transformer the invention is, of course, not restricted to this application, but modifications and supplements can be made to the construction of the circuit, for example by using thyristors in place of semiconductor diodes, by applying further capacitors for reducing interfering voltages, resistances for the balancing of the voltages which arise over the impedances Z2 and Z3, etc., without exceeding the scope of the invention.

I claim:

1. Circuit for the detection of an asymmetry in the magnetization current of a magnetic modulator caused by a modulating current in a magnetic modulator for zero flux detection comprising first and second substantially identical wound magnetic cores, each at least provided with a primary winding and a series circuit of an auxiliary winding and an impedance voltage proportional to the magnetization current is generated during operation, it being necessary to supply the reference alternating voltage to the respective series circuits, each of said series circuits having first and second connecting terminals to which a common reference voltage source is connected, for providing each of said first and second magnet cores with said magnetization current, such that substantially no resultant induction current is induced in the modulating current, said modulating current being applied to a series connection of the primary windings of said first and second magnet cores, and further comprising a bipolar peak value detector having input and output connecting terminals, said input connecting terminals being connected across the impedance of one of said series circuits, the voltage across said impedance being proportional to the magnetization current of said one series circuit, the amplitude of the signal at the output connecting terminals of said bipolar peak value detector representing the degree of asymmetry of said magnetization current, a further bipolar peak value detector having input and output connecting terminals, said input connecting terminals being connected across the impedance of the other of said series circuits, and processing means having input and output connecting terminals, the output connecting terminals of said bipolar peak value detectors being connected to the input connecting terminals of said processing means, and the output signal at the output connecting terminals of said processing means being substantially ripple-free for symmetrical magnetization currents.

2. Circuit according to claim 1, in which at least one of said bipolar peak value detectors is a peak rectifier, comprising first and second devices having a diode which, respectively, are connected to first and second elements having a capacitive function such that a portion of the positive half period of the voltage across the impedance of one of said series circuits, which is proportional to said magnetization current, is stored in said first element and a portion of the negative half period of said voltage is stored in said second element, further comprising summation devices for the summation of the voltages stored in said first and second elements, the output of said summation devices constituting the output of one of said bipolar peak value detectors, and further comprising third and fourth devices having a diode function which, respectively, are connected to said third and fourth elements having a capacitive function such that a portion of the positive half period of the voltage across the impedance of the other series circuit, which is proportional to the magnetization current, is stored in the said third element and a portion of the negative half period of said voltage is stored in said fourth element, and further comprising summation devices for the summation of the voltages over said third and fourth elements, the output of said further summation devices constituting the output of the said further bipolar peak value detector.

3. Circuit according to claim 2, in which the anode connection of said first devices is connected to the cathode connection of said second devices and their connection point constitutes one input connection point of one of said bipolar peak value detectors, the first and second elements being formed by first and second capacitors connected to one another by one of their electrodes and their connection point forming the other input connection point of said one of said bipolar peak value detectors, and the other electrode of said first capacitor being connected to the cathode connection of said first devices and to one electrode of a first resistance, and the other electrode of the second capacitor being connected to the anode connection of the second devices and to one electrode of a second resistance, said resistances are connected to one another by their other electrodes and their connection point constitutes the output of one bipolar peak value detector, and wherein the anode connection of said third devices is connected to the cathode connection of said fourth devices and their connection point constitutes one input connection point of said further bipolar peak value detector, said third and fourth elements being formed by third and fourth capacitors connected to one another by one of their electrodes and their connection point constitutes the other input connection point of said further bipolar peak value detector, and the other electrode of said third capacitor is connected to the cathode connection of said third devices and to one electrode of a third resistance, and the other electrode of said fourth capacitor is connected to the anode connection of said fourth devices and to one electrode of a fourth resistance, said resistances being connected to one another by their other electrodes and their connection point constitutes the output of said further bipolar peak value detector.

4. Circuit according to claim 3, wherein said first, second, third and fourth devices are semiconductor diodes having substantially identical electrical characteristics and are located in the same substrate of semiconductor material.

5. Circuit according to claim 3, wherein said first, second, third and fourth devices each consist of a differential amplifier, the output of which is connected to the inverting input thereof via a series circuit of a resistance and a semiconductor diode and further comprising a further semiconductor diode connected anti-parallel to said series circuit, the forward direction of the device having a diode action corresponding to the forward direction of the semiconductor diode in said series circuit, and the anode and cathode connections corresponding therewith being formed by the connection point of said resistance and said semiconductor diode and by the free electrode of a further resistance connected to the inverting input of said differential amplifier.

6. Circuit according to claim 1, wherein said means for processing the output signals of the two bipolar peak value detectors comprise devices for the summation of said output signals.

7. Circuit according to claim 6, wherein said devices for the summation of the output signals of the two bipolar peak value detectors comprise a differential amplifier, the outputs of said bipolar peak value detectors being connected to the differential inputs of said differential amplifier and the output thereof constituting the output of the circuit.

8. Measurement circuit for the accurate measurement of direct and alternating current, comprising substantially first, second and third transformer, having primary windings, connected in series with one another, to be fed with the current to be measured, and having secondary windings, connected in series with one another, and connected to the output of an amplifier circuit, and having auxiliary windings, wherein the auxiliary winding of the first transformer being connected to the input of the amplifier circuit and the auxiliary winding of the second and third transformer each constituting a series circuit of an impedance and reference voltage source, which impedances are each connected to the inputs of a first and second bipolar peak value detector, respectively, the outputs of said first and second bipolar peak value detectors being connected to the inputs of signal summation means, the output of which is connected to the input of the amplifier circuit.

* * * * *